(12) United States Patent
Tenten et al.

(10) Patent No.: US 6,590,460 B1
(45) Date of Patent: Jul. 8, 2003

(54) REDUCED HARMONIC DISTORTION OSCILLATOR CIRCUIT

(75) Inventors: Wilfried Tenten, Gammertingen (DE); Friedemann Eberhardt, Deutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/857,931

(22) PCT Filed: Oct. 7, 1999

(86) PCT No.: PCT/DE99/03229

§ 371 (c)(1),
(2), (4) Date: Oct. 12, 2001

(87) PCT Pub. No.: WO00/35089

PCT Pub. Date: Jun. 15, 2000

(30) Foreign Application Priority Data

Dec. 10, 1998 (DE) .......................... 198 56 932

(51) Int. Cl.⁷ ................................. H03B 1/00
(52) U.S. Cl. .......................... 331/74; 331/109
(58) Field of Search .................. 331/74, 109, 182, 331/183, 175

(56) References Cited

U.S. PATENT DOCUMENTS 3,851,276 A  * 11/1974 Kaplan .................... 331/108 D
4,613,830 A  *  9/1986 Kamiya et al. ......... 324/207.26
4,999,588 A  *  3/1991 Koch ......................... 331/109
5,455,542 A  * 10/1995 Spence et al. ......... 331/116 FE
5,606,292 A  *  2/1997 Oh .......................... 331/108 A

FOREIGN PATENT DOCUMENTS

EP          0 384 938        9/1990

OTHER PUBLICATIONS

Andrew M. Hudor, Jr., *FET-controlled crystal yields low distortion*, EDN Electrical Design News, Nov. 20, 1980, vol. 25, No. 21, p. 201.
Fortier et al.,, *A linearized model of a twin-T RC oscillator employing an amplitude control system with multipliers*, Int. J. Electronics, vol. 61, No. 5, pp. 617–625, 1986.
A. Benjaminson, *Bridge Circuits enhance Crystal-Oscillator Stability*, Microwaves & RF, vol. 34, No. 11, pp. 85–97, 1995.
E. A. Vittoz et al., *High-Performance Crystal Oscillator Circuits: Theory and Application*, IEEE Journal of Solid-State Circuits, vol. 23, No. 3, Jun. 1988, pp. 774–783.

* cited by examiner

Primary Examiner—Robert Pascal
Assistant Examiner—Joseph Chang
(74) Attorney, Agent, or Firm—Kenyon & Kenyon

(57) ABSTRACT

A harmonically damped oscillator circuit including a controllable oscillator amplifier for generating an oscillator output signal and including an amplitude control circuit for controlling the amplitude A of the oscillator output signal, an amplitude control signal $V_{control}$ being generated by the amplitude control circuit as a function of a determined amplitude A of the oscillator output signal in such a manner that the oscillator amplifier functions in a predefined operating range having an approximately linear amplification characteristic with a definable, small amplitude at a preset operating point, and the oscillator amplifier being designed in such a manner that the predefined operating range and the preset operating point are independent of the amplitude control signal $V_{control}$. Thus, a stable amplitude loop for producing a low-distortion oscillator output signal can be achieved also under consideration of a comparatively large scatter range of the used component characteristics and parameters. The oscillator circuit can, therefore, be effectively produced as an integrated circuit.

13 Claims, 5 Drawing Sheets

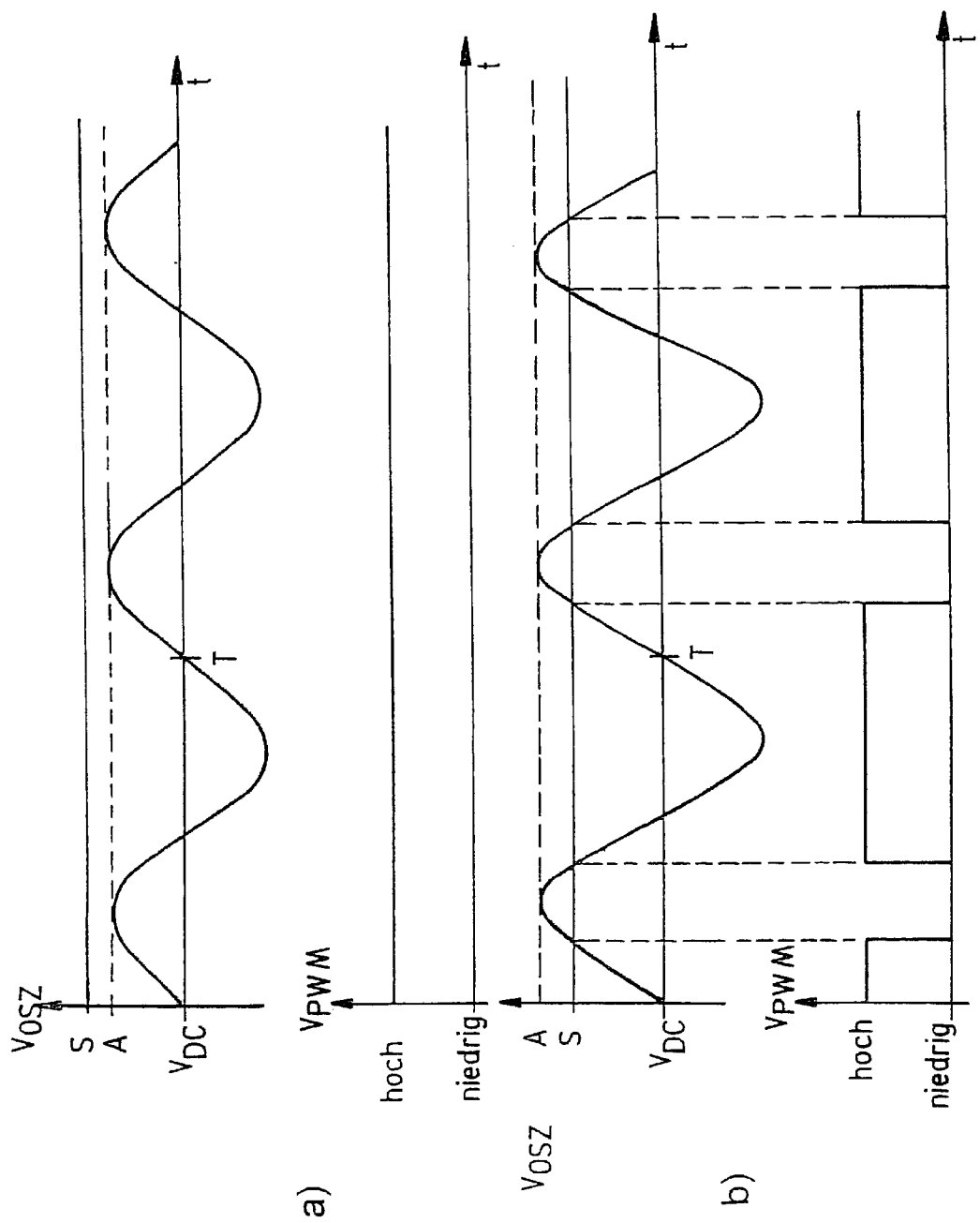

REDUCED HARMONIC DISTORTION OSCILLATOR CIRCUIT

FIELD OF THE INVENTION

The present invention relates to a harmonically damped oscillator circuit.

BACKGROUND OF THE INVENTION

Oscillator circuits are used for clocking in analog as well as digital electronic circuits. In the context, a quartz element is typically used for frequency stabilization, the quartz element being capable of being connected in parallel to an oscillator amplifier in a so-called π-structure. The external quartz is necessary for precisely selecting the frequency, while the internal oscillator amplifier supplies the needed energy for maintaining the oscillation.

This circuit engineering involves large amplitudes of the quartz oscillation. Consequently, the non-linear large-signal response of the oscillator amplifier result in a high harmonic component of the quartz oscillation and/or a high distortion factor, which, for the known oscillators, is in the order of 5%. Such harmonic waves are noticeable in connection with the large amplitudes as parasitically conducted interference of sensitive, analog signals, in particular when the oscillator signal is directed by a pad structure and pin structure, which is large in comparison with other components. The high distortion component and large amplitude of such a known oscillator, therefore, result in a decrease in quality and yield.

An amplitude control system for attenuating the harmonic distortion of an oscillator that is achieved with the aid of operational amplifier circuits and multipliers is known from G. J. Fortier and I. M. Filanovsky, "A linearized model of a twin-T RC oscillator employing an amplitude control system with multipliers", Int. J. Electronics, Vol. 61, No. 5, pgs. 617–625, 1986. This amplitude control system is designed for use in the audio range (frequencies in the KHz range) and no longer functions reliably at higher frequencies. Furthermore, the oscillator is produced using discrete components for which it is possible to precisely adjust the parameter values. However, such discrete circuits having individually calibrated components are complicated and expensive.

A low-distortion oscillator in the MHz range is described in A. Benjaminson, "Bridge Circuits enhance Crystal-Oscillator Stability", Microwaves & RF, Vol. 34, No. 11, pgs. 85–97, 1995. However, this design approach also requires a plurality of discrete elements, among other things, a so-called hot carrier diode, as part of the amplitude control system. This design is, therefore, too expensive for mass production of application-specific, integrated circuits (ASICs). Moreover, the amplitude of 800 mV used in this design is much too high.

The circuit known from B. Harvey, "Oscillators blend Low Noise and Stable Amplitude", Microwaves & RF, Vol. 33, No. 13, pgs. 125–129, 1994 also necessitates a plurality of discrete elements, in some instances, even a plurality of integrated circuits. The amplitude is also too high at about 500 mV.

E. A. Vittoz et al., "High-Performance Crystal Oscillator Circuits: Theory and Application", IEEE Journal of Solid-State Circuits, Vol. 23, No. 3, June 1988, pgs. 774–783 describe an oscillator that can be integrated in a CMOS and is above all intended to enable frequency stability and low power consumption and proposes an amplitude control system for this purpose. However, this design uses low-voltage processes (1.1 V), and the transistors of the amplitude control system function in weak inversion. Due to the low currents, this control is too sensitive with respect to supply-voltage ripples as they occur in larger mixed-signal integrated circuits, which unite digital and analog circuits.

An amplitude control via a rectifier is proposed in U. Tietze, C. Schenk "Halbleiterschaltungstechnik", $10^{th}$ edition. However, in CMOS technology, the switching threshold of a rectifier can only be very roughly adjusted. Moreover, the voltage drop of a diode (about 500 mV) goes directly into the switching threshold and, as such, also into the amplitude. Thus, this circuit design for producing a harmonically damped oscillator circuit is too inexact for sensitive signal processing integrated circuits.

None of the known oscillator circuits can be produced in an integrated form and functions reliably and stably even in the case of large degrees of scatter in the individual component characteristics due to fluctuations in the process parameters. Large fluctuations in temperature from −40° C. to +125° C. and supply ripples of several megahertz also affect the function of the known oscillator circuits.

SUMMARY OF THE INVENTION

The harmonically damped oscillator circuit according to the present invention has a controllable oscillator amplifier for producing an oscillator output signal and an amplitude control circuit for controlling the amplitude of the oscillator output signal. The amplitude control circuit generates an amplitude control signal as a function of the determined amplitude of the oscillator output signal in such a manner that the oscillator amplifier functions in a preset operating range at a predefined operating point in which the oscillator amplifier functions linearly and, therefore, produces a low harmonic component, the oscillator amplifier being designed in such a manner that the preset operating range and the preset operating point are independent of the amplitude control signal $V_{control}$. The amplitude can be variably set in a range of about 50–200 mV and is stable in the case of parameter fluctuations such as temperature fluctuations or interference. As a result, the amplitude can be reliably and stably controlled even using components that cannot be individually set or calibrated and whose electronic characteristics have a certain degree of scatter due to the manufacturing process.

The amplitude control signal can be fed directly to the oscillation amplifier itself or can set the resistance value of a feedback resistor connected in parallel to the oscillator amplifier.

The amplitude control circuit can have a comparator circuit and a low-pass filter, the comparator circuit producing a pulse width modulation signal by comparing the amplitude of the oscillator output signal to a predefined threshold value, the signal then being input into the low-pass filter to generate the control signal. In this context, the low-pass filter is preferably a higher order filter, in particular third order, the switching edges of the pulse width modulation signal being so strongly attenuated by the comparator circuit that the oscillator output signal is not affected by high frequency components of the control signal. The switching time of the comparator circuit should, therefore, be short with respect to the oscillator period.

According to a variant of the oscillator circuit according to the present invention, the comparator generates a pulse width modulation signal whose pulse duty ratio is:

$$\frac{T_0}{T} = \frac{1}{\pi} \cdot \text{acos}\frac{S}{A} \text{ for } A > S, \text{ and } 0 \text{ for } A \leq S$$

T being the period duration of the oscillator and $T_0$ being the duration of the low-level state of the pulse width modulation signal within a period.

The pulse width modulation signal then has low-level pulse segments when amplitude A exceeds the predefined threshold value S, the portion of low-level segments of an entire period increasing up to ½ when the amplitude of the oscillator output signal increases to a value significantly greater than S. This pulse width modulation signal is then fed through the low-pass filter to generate the "smooth" amplitude control signal $V_{control}$.

Preferably, the comparator circuit has a plurality of series-connected inverters, since very short switching times are to be achieved with CMOS inverters. A sufficient amplification can be achieved with the aid of a series-connected inverter cascade. By suitably dimensioning the first inverter, the effect of the comparator on the oscillator signal can be minimized (miller effect).

By suitably selecting threshold value S, amplitude A of the oscillator output signal can be suitably selected, an amplitude between 50 mV and 200 mV, in particular approximately 100 mV, being preferred. The dimensioning of the first inverter defines switching threshold S. The characteristic of "matching" integrated components causes S to remain almost constant even in response to parameter fluctuations (matching between transistors of the oscillator amplifier and transistors of the first compensator inverter).

The oscillator circuit according to the present invention can be advantageously produced as an integrated circuit or part of an application-specific integrated circuit (ASIC).

BRIEF DESCRIPTION OF THE DRAWINGS

FIG. 5 shows the oscillator output signal and the pulse width signal in time lapse.

DETAILED DESCRIPTION

Figure 1:
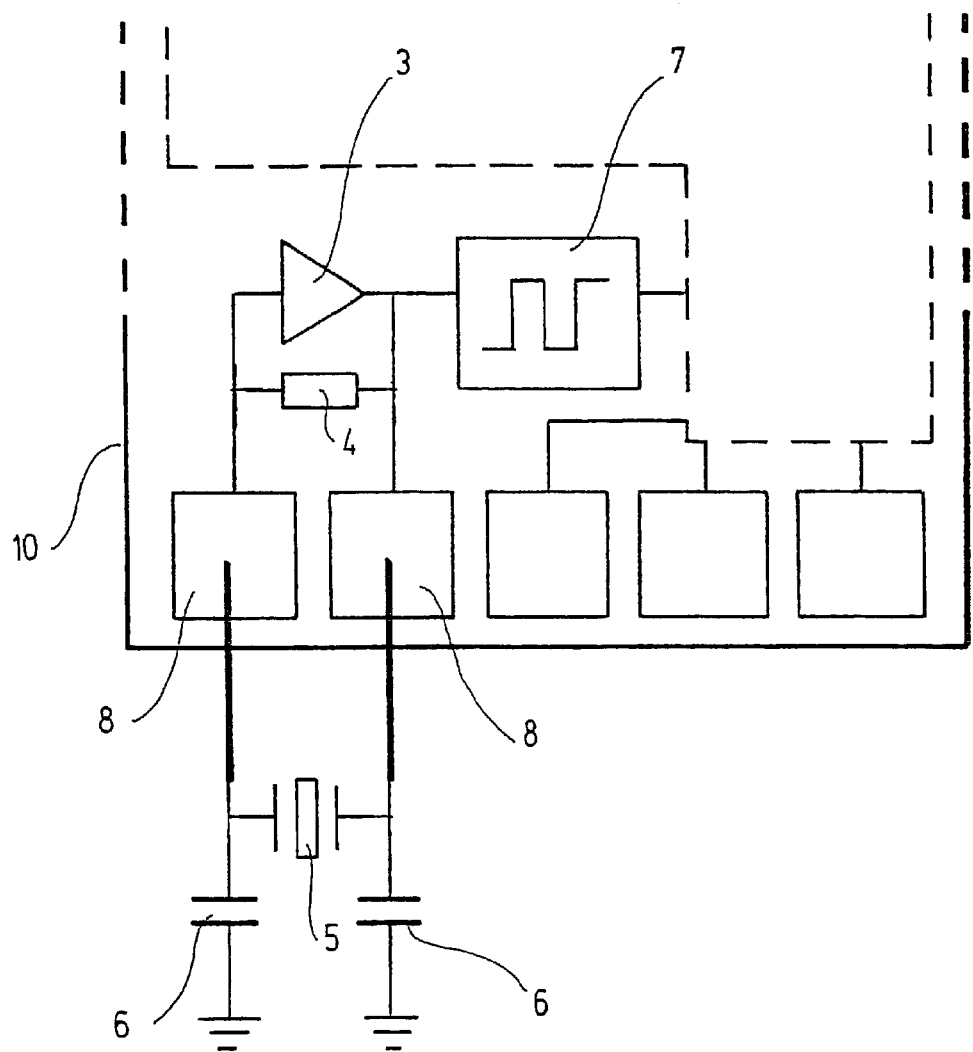
FIG. 1 is a circuit diagram that schematically shows an oscillator circuit produced on a chip and having an external quartz oscillator.

FIG. 1 schematically shows an oscillator circuit on a chip for producing a clock signal for an electronic circuit, e.g. an integrated mixed-signal CMOS circuit having components for analog signal processing as well as digital signal processing. An oscillator amplifier 3 having a parallelly connected feedback resistor 4 is situated on chip 10. An external quartz 5 is connected via connection pads 8, both connection terminals then being grounded via capacitors 6. The oscillator output signal of the oscillator amplifier is fed to a clocking circuit 7 from which the clocking signal is fed to the function circuit produced on chip 10.

Figure 2:
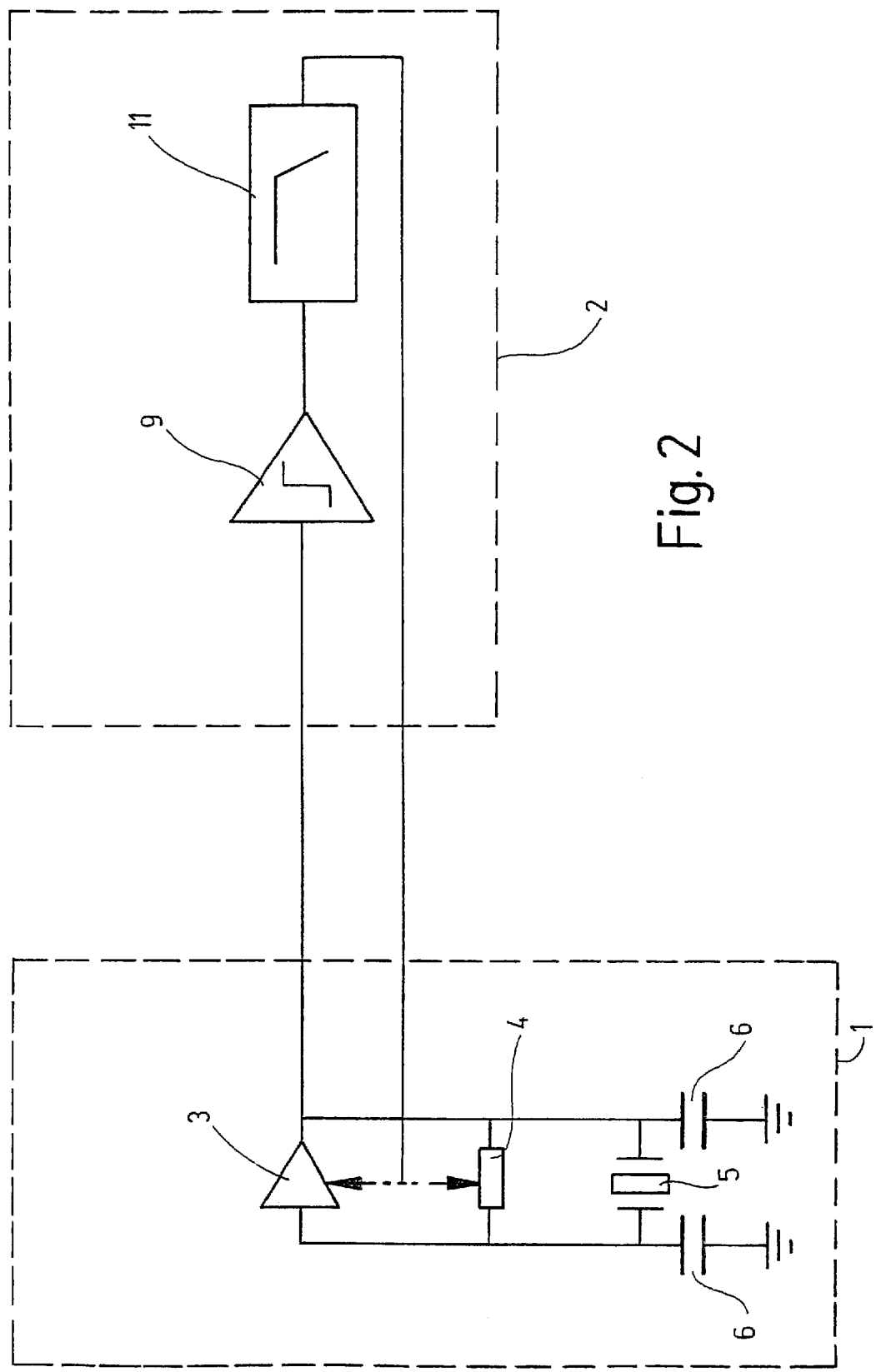
FIG. 2 shows a block diagram of an oscillator circuit according to the present invention.

FIG. 2 shows the block diagram of an exemplary embodiment of the harmonically damped oscillator circuit according to the present invention. Oscillator amplifier 3, feedback resistor 4, and external quartz-crystal oscillator 5 are interconnected as shown in FIG. 1. However, prior to being fed to the clocking circuit, the oscillator output signal passes through amplitude control circuit 2, which includes a comparator 9 and a low-pass filter 11. The amplitude control circuit is used for restricting amplitude A of the oscillator output signal to a specific value, e.g. 100 mV, so that oscillator amplifier 3 functions in a linear operating range in which the harmonic generation is reduced to a minimum. The control signal $V_{control}$ emitted by the low-pass filter is either directly fed to oscillator amplifier 3 or to a controllable feedback resistor 4 connected in parallel thereto, as indicated in the figure by an arrow between amplifier 3 and resistor 4.

Comparator circuit 9 compares amplitude A of one oscillator output signal $V_{DC}$+Asin (wT) input at one of the its connection terminals to a threshold value S and generates, as a function of values A and S, a pulse width modulation signal that via low-pass filter 11, which is preferably configured as a third order filter, so that a time-averaged, "smooth" control signal $V_{control}$ is available at the output of the low-pass filter and is fed back to oscillator 1.

According to a preferred exemplary embodiment, comparator circuit 9 generates a pulse width modulated signal having the following characteristics:

$$\frac{T_0}{T} = \frac{1}{\pi} \cdot \text{acos}\frac{S}{A}, A > S \qquad 0, A \leq S, \qquad (1)$$

$$\frac{T_1}{T} = 1 - \frac{T_0}{T} \qquad (2)$$

T being the oscillator period, $T_0$ being the duration of a low-level state within a period, and $T_1$ being the duration of a high-level state within a period.

The pulse width modulated signal $V_{PWM}$ available at the output of comparator 9 is illustrated in FIG. 5 as a function of the amplitude of oscillator output signal $V_{OSZ}$ for both cases, A>S (FIG. 5a) and A<S (FIG. 5b). If amplitude A of oscillator output signal $V_{OSZ}$ is less than threshold value S, pulse width modulation signal $V_{PWM}$ remains constant at a high level according to the second case of equation (1), as shown in FIG. 5a. However, if amplitude A of oscillation output signal $V_{OSZ}$ exceeds threshold value S, the comparator circuit always then emits a pulse width signal $V_{PWM}$ having a low level, provided that amplitude A is greater than threshold value S (see FIG. 5b). According to the first part of equation (1), the duration of low-level state $T_0$ increases with an growing amplitude in relation to period duration T and reaches the value ½ for A→∞.

If one assumes that the high-level state of the comparator corresponds to VDD and the low-level state to VSS=0V, the time average of the pulse width modulation signal is:

$$\overline{V}_{PWM} = VDD\left(1 - \frac{1}{\pi}\text{acos}\frac{S}{A}\right) \qquad (3)$$

The alternating-current components of the pulse width modulation signal are damped by low-pass filter 11, so that time-averaged signal $\overline{V}_{PWM}$ modified by the filter transfer function is ultimately available at the output of the amplitude control circuit as the control signal:

$$V_{regel} = -\frac{R_2}{R_1}(\overline{V}_{PWM} - V_{ref}) + V_{ref} \qquad (4)$$

In this context, $R_1$ and $R_2$ are the resistances of an active filter circuit and $V_{ref}$ is a reference voltage.

With the aid of the thus-produced control voltage $V_{control}$, either oscillator amplifier 9 itself or the parallelly connected, controllable feedback resistor 4 can be controlled in such a manner that oscillator amplifier 3 functions in a linear, low-harmonic operating range, and that the pole of the oscillator transfer function lies on the imaginary shoulder, and the amplitude of the oscillation assumes a constant value. In this context, the amplitude can be variably adjusted in an exact manner to within a few units of 10 mV.

Figure 3:
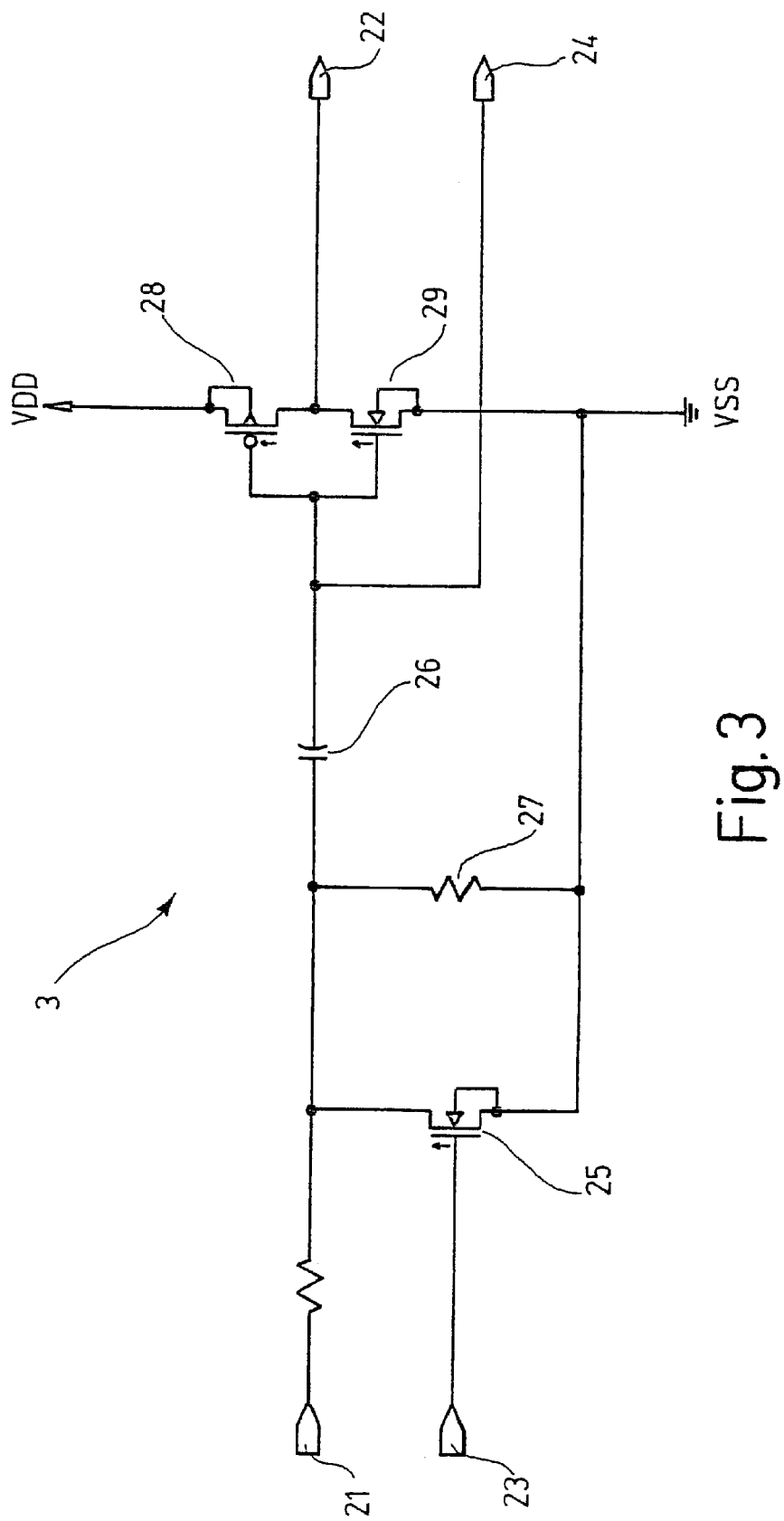
FIG. 3 shows a circuit diagram of an exemplary embodiment of an oscillator amplifier according to the present invention.

FIG. 3 shows the circuit diagram of an exemplary embodiment of a controllable oscillator amplifier whose effective amplification can be controlled due to a feedback signal $V_{control}$ applied at input 23. A quartz-crystal oscillator is externally connected between connection terminals 21 and 22, and the feedback resistor is connected between connection terminals 22 and 24. Transistors 25 and 29 are designed as n-channel transistors and transistor 28 as a p-channel transistor. The amplitude-controlled oscillator output voltage is available at output terminal 22. In this context, both the operating point and the linear operating range of this amplifier at the operating point are independent of the control voltage $V_{control}$ input at connection terminal 23. As a result, a stable loop can be achieved.

Figure 4:
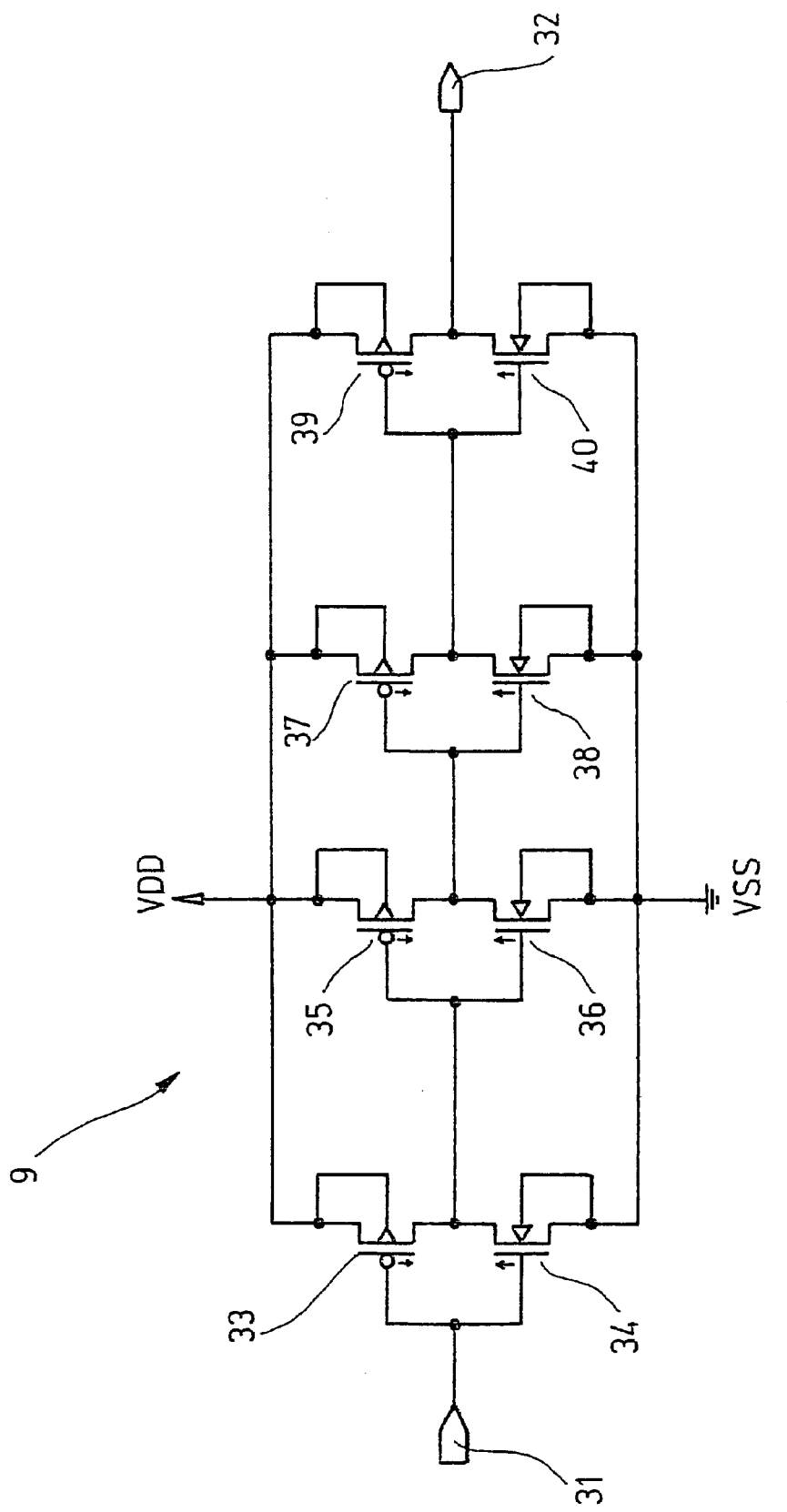
FIG. 4 shows a circuit diagram of an exemplary embodiment of a comparator according to the present invention.

An exemplary embodiment of comparator 9 is represented in FIG. 4. The comparator includes four inverter steps, each including a pair of p-channel and n-channel transistors, respectively, 33, 34; 35, 36; 37, 38 and 39, 40. The transistors are preferably designed using CMOS technology and permit very short switching times in the order of 2 ns. The switching time of the comparator should be short with respect to oscillator period duration T to ensure a clean pulse width modulation signal.

A sufficient amplification is achieved with the aid of the four-step inverter cascade. The dimensioning of the first inverter is preferably selected in such a manner that the effect of the comparator on the oscillator signal is minimized (miller effect). The oscillator output signal is input at connection terminal 31, and pulse width modulated signal $V_{PWM}$ is made available at output 32. The advantage of this comparator is that as a result of selecting suitable with ratios of transistor 33, 34 of the first inverter step, threshold value S can be sufficiently exactly adjusted relatively to the operating point of oscillator amplifier 3 despite fluctuations in the parameters. Since the control voltage changes very quickly with A in the case of A=S (see equations 3 and 4), controlled amplitude A can be adjusted with the necessary accuracy also in the case of smaller values of the amplitude, e.g. 100 mV.

A third order low-pass filter can be used as low-pass filter 11 of the amplitude control circuit. In this context, the time constants are selected in such a manner that a stable control is the result. Using the low-pass filter, an attenuation of the switching edges of the pulse width modulation signal of 86 dB can be achieved, which enables control voltage $V_{control}$ to be coupled in a low-interference manner into the oscillator.

Using the amplitude-attenuated and harmonically damped oscillator according to the present invention, it is possible to minimize the interference effect of the quartz oscillator signals in the MHz range on sensitive, analog signals. The circuit and in particular the oscillator amplifier are dimensioned in such a manner that a reliable method of operation is achieved over the entire scatter range of the quartz parameters and other component parameters and environmental influences, such as temperature, without needing to adjust or calibrate. Thus, the harmonically damped oscillator according to the present invention can be inexpensively produced in an integrated manner using a standard CMOS process. At the same time, as a result of the control amplitude, which can be variably adjusted via threshold value S, a stable transient oscillation of the oscillator can be ensured also in the case of the digital components interfering with the integrated circuit.

In the following, two exemplary oscillator circuits according to the present invention are compared to an oscillation circuit not having amplitude control.

In this context, table 1 shows the measured amplitudes and corresponding standard deviations for VDD=5V for two exemplary oscillator circuits according to the present invention and for a standard oscillation circuit not having amplitude control.

TABLE 1

| Oscillator | Amplitude A | Standard Deviation $\sigma_A$ |
| --- | --- | --- |
| Standard circuit | 2550 mV | — |
| Example I | 167 mV | 26 mV |
| Example II | 63 mV | 16 mv |

In addition to the amplitude, the harmonic component is also significantly reduced. In table 2, the harmonic distortion factors of the exemplary circuits are compared to those of the standard circuit.

TABLE 2

| Oscillator | Harmonic distortion factor |
| --- | --- |
| Standard circuit | 3.95% |
| Example I | 0.67% |
| Example II | 0.36% |

To compare the interference effect of the oscillator signal of the harmonically damped oscillator circuit according to the present invention to that of a standard oscillator circuit, the measured values of the amplitudes of the fundamental waves and harmonic waves of both oscillators are represented in table 3 in a logarithmic scale with respect to the fundamental wave of the standard oscillator.

TABLE 3

|  | Fundamental wave | $1^{st}$ harmonic wave | $2^{nd}$ harmonic wave | $3^{rd}$ harmonic wave | $4^{th}$ harmonic wave |
| --- | --- | --- | --- | --- | --- |
| Standard | 0 dB | −35 dB | −30 dB | −43 dB | −40 dB |
| Example I | −27 dB | −70 dB | −93 dB | −99 dB | <−100 dB |
|  | $5^{th}$ harmonic wave | $6^{th}$ harmonic wave | $7^{th}$ harmonic wave | $8^{th}$ harmonic wave | $9^{th}$ harmonic wave |
| Standard | −47 dB | −43 dB | −55 dB | −52 dB | −58 dB |
| Example I | <−100 dB | <−100 dB | <−100 dB | <−100 dB | <−100 dB |

The measured values represented in table 3 show that, starting from the second harmonic wave, attenuations of more than 90 dB can be attained with respect to the standard fundamental wave. In contrast, the standard oscillation circuit shows attenuations of 30 dB starting from the third harmonic wave, the following harmonic wave attenuations being between 40 dB and 60 dB. According to example I, the harmonic waves of a high frequency, which are particularly critical with respect to capacitive and transmitted interference, are reduced via the harmonically damped oscillator circuit according to the present invention by more than 50 dB in comparison with the harmonic waves of a known circuit.

What is claimed is:

1. A harmonic distortion-attenuated oscillator circuit, comprising:
   a controllable oscillator amplifier for generating an oscillator output signal; and
   an amplitude control circuit for controlling an amplitude of the oscillator output signal and for generating an amplitude control signal for controlling the controllable oscillator amplifier as a function of a determined amplitude of the oscillator output signal such that the controllable oscillator amplifier functions in a predefined operating range having an approximately linear amplification characteristic at a preset operating point, wherein:
      the controllable oscillator amplifier is designed such that the predefined operating range and the preset operating point are independent of the amplitude control signal, and
      the amplitude control circuit includes:
         a comparator circuit for producing a pulse width modulation signal by comparing the determined amplitude of the oscillator output signal to a predefined threshold value, and
         a low-pass filter to which the pulse width modulation signal is fed to generate the amplitude control signal.

2. The harmonically damped oscillator circuit according to claim 1, further comprising:
   a controllable feedback resistor connected in parallel to the controllable oscillator amplifier, wherein:
      a resistance value of the controllable feedback resistor can be adjusted in accordance with the amplitude control signal.

3. The harmonically damped oscillator circuit according to claim 1, wherein:
   the amplitude control signal is fed to the controllable oscillator amplifier.

4. The harmonically damped oscillator circuit according to claim 1, wherein:
   the low-pass filter includes a higher order filter.

5. The harmonically damped,oscillator circuit according to claim 4, wherein:
   the higher order filter includes a third order filter.

6. The harmonically damped oscillator circuit according to claim 1, wherein:
   a transmission characteristic of the low-pass filter is selected such that switching edges of the pulse width modulation signal are so strongly attenuated by the comparator circuit that the oscillator output signal is not affected by high frequency fluctuations of the amplitude control signal.

7. The harmonically damped oscillator circuit according to claim 1, wherein:
   a switching time of the comparator circuit is short in comparison with an oscillator period.

8. The harmonically damped oscillator circuit according to claim 1, wherein:
   the pulse width modulation signal has pulse duty ratio defined as:

$$\frac{T_0}{T} = \frac{1}{\pi} \cdot \mathrm{acos} \frac{S}{A} \text{ for } A > S, \text{ and } 0 \text{ for } A \leq S,$$

T being a period duration of an oscillator and $T_0$ being a duration of a low-level state of the pulse width modulation signal within a period.

9. The harmonically damped oscillator circuit according to claim 1, wherein:
   the comparator circuit includes a plurality of series-connected inverters.

10. The harmonically damped oscillator circuit according to claim 1, wherein:
   an amplitude of the oscillator output signal is adjusted to a small value relative to a supply voltage.

11. The harmonically damped oscillator circuit according to claim 10, wherein:
   the amplitude of the oscillator output signal is adjusted to between 50 mV and 200 mV.

12. The harmonically damped oscillator circuit according to claim 1, further comprising:
   a quartz element for stabilizing a frequency.

13. The harmonically damped oscillator circuit according to claim 1, wherein:
   the oscillator circuit is produced as an integrated circuit.

* * * * *